United States Patent [19]

Brown et al.

[11] 4,277,699
[45] Jul. 7, 1981

[54] LATCH CIRCUIT OPERABLE AS A D-TYPE EDGE TRIGGER

[75] Inventors: David J. Brown, North Baddesley, England; Ronald G. Walther, Raleigh, N.C.; Thomas W. Williams, Longmont, Colo.; Michael D. Wrigglesworth, Pembroke Park, England

[73] Assignee: International Business Machines Corporation, Armonk, N.Y.

[21] Appl. No.: 60,933

[22] Filed: Jul. 26, 1979

[30] Foreign Application Priority Data

Oct. 2, 1978 [GB] United Kingdom ............... 39000/78

[51] Int. Cl.³ ........................................... H03K 3/037
[52] U.S. Cl. ............................. 307/272 R; 307/221 R; 307/291
[58] Field of Search ................... 307/269, 289, 272 R, 307/291, 221 R; 324/73 R; 235/92 EC; 364/716, 900; 340/514, 515, 518; 328/41, 43

[56] References Cited

U.S. PATENT DOCUMENTS

| 3,761,695 | 9/1973 | Eichelberger ..................... 324/73 R |
| 3,783,254 | 1/1974 | Eichelberger ..................... 307/203 |
| 3,784,907 | 1/1974 | Eichelberger .................. 324/57 DE |
| 4,006,492 | 2/1977 | Eichelberger et al. ................. 357/45 |
| 4,051,352 | 9/1977 | Eichelberger et al. .............. 364/716 |
| 4,051,353 | 9/1977 | Lee ....................................... 364/716 |
| 4,063,078 | 12/1977 | DasGupta et al. .................. 364/700 |
| 4,063,080 | 12/1977 | Eichelberger et al. ......... 324/73 AT |

OTHER PUBLICATIONS

T. W. Williams, "Single Clock Shift Register Latch" IBM Technical Disclosure Bulletin, vol. 16, No. 6, Nov. 1973, p. 1961.

Primary Examiner—John Zazworsky
Attorney, Agent, or Firm—Wesley DeBruin

[57] ABSTRACT

A shift register latch circuit (FIG. 1) comprised of a polarity hold latch 1 connected to a set/reset latch 2. The latches can be clocked with separate non-overlapping clock trains (+A, +B and +C) so that automatically generated test patterns can be applied to a scan input S to test the circuit. This conforms to the so-called Level Sensitive Scan Design (LSSD) rules. During system operation, the shift register latch circuit operates as a 'D' type edge trigger by connecting the clock input +B of the set/reset latch 2 to the clock −C supplied to the polarity hold latch 1. By connecting a number of shift register latches together a Johnson counter can be formed and by clocking all latches with a single oscillator, a series of non-overlapping clock trains can be produced. Implementations of the shift register latch in AND circuits or AND OR INVERT circuits are described.

4 Claims, 7 Drawing Figures

LATCH CIRCUIT OPERABLE AS A D-TYPE EDGE TRIGGER

CROSS-REFERENCE TO RELATED PATENTS AND A PUBLICATION

U.S. Pat. No. 4,063,080 entitled "Method of Propagation Delay Testing A Level Sensitive Embedded Array Logic System", filed June 30, 1976, granted Dec. 13, 1977 to E. B. Eichelberger, E. I. Muehldorf, R. G. Walther and T. W. Williams, and of common assignee.

U.S. Pat. No. 4,051,352 entitled "Level Sensitive Embedded Array Logic System", filed June 30, 1976, granted Sept. 27, 1977 to E. B. Eichelberger, E. I. Muehldorf, R. G. Walther and T. W. Williams, and of common assignee.

U.S. Pat. No. 4,006,492 entitled, "High Density Semiconductor Chip Organization" filed June 23, 1975, granted Feb. 1, 1977 to E. B. Eichelberger and G. J. Robbins, and of common assignee.

U.S. Pat. No. 4,051,353 entitled "Implementation of Level Sensitive Logic System Employing Accordion Shift Register Means", filed June 30, 1976, granted Sept. 27, 1977 to Hua-Tung Lee, and of common assignee.

U.S. Pat. No. 4,063,078 entitled "Clock Generation Network" filed June 30, 1976, granted Dec. 13, 1977 to E. B. Eichelberger and S. DasGupta, and of common assignee.

U.S. Pat. No. 3,783,254 entitled "Level Sensitive Logic System", filed Oct. 16, 1972, granted Jan. 1, 1974 to Edward B. Eichelberger and of common assignee.

U.S. Pat. No. 3,761,695 entitled "Method of Level Sensitive Testing A Functional Logic System" filed Oct. 16, 1972 granted Sept. 25, 1973 to Edward B. Eichelberger and of common assignee.

U.S. Pat. No. 3,784,907 entitled "Method of Propagation Delay Testing A Functional Logic System" filed Oct. 16, 1972 granted Jan. 8, 1974 to Edward B. Eichelberger and of common assignee.

IBM Technical Disclosure Bulletin Publication entitled "Single Clock Shift Register Latch" by T. W. Williams, Vol. 16, No. 6, November 1973, page 1961.

FIELD OF THE INVENTION

This invention relates to a latch circuit operable as a D-type edge trigger. The latch circuit conforms with LSSD rules as disclosed in U.S. Pat. No. 3,761,695.

BACKGROUND OF THE INVENTION AND PRIOR ART

U.S. Pat. No. 4,063,078 describes a clock generation network for generating at least a pair of non-overlapping clock trains from a single oscillator input. The network complies with so-called Level Sensitive Scan Design (LSSD) rules which are, in turn, described in U.S. Pat. Nos. 3,761,695; 3,783,254 and 3,784,907. A logic network designed within the LSSD rules requires sequential logic to be controlled by two or more non-overlapping clock trains. The purpose of LSSD is to enable logic networks embodied in large scale integrated semiconductor devices to be adequately tested. The clock generation network of the aforementioned U.S. Pat. No. 4,063,078 has the advantage that it is fully testable, it can be integrated on the same semiconductor chip as logic circuits conforming to the LSSD rules, and during the test the test generation system can generate tests for the clock network as well as the logic network it controls.

It is often required to use the well-established "D" type edge trigger in high speed counting and other situations. Unfortunately, although a 'D'-type edge trigger can be economically fabricated from six NAND gates, it contains several feedback paths which are very difficult to test by automatic test pattern generation without using additional input/output terminals. Additionally such a trigger would not conform to the LSSD rules mentioned above.

SUMMARY OF THE INVENTION

An object of the present invention is to provide a latch circuit which conforms to the LSSD design rules and which is operable as an edge trigger.

According to the invention, a shift register latch operable as a 'D' type edge trigger comprises a data input latch in the form of a polarity hold latch and a data output latch in the form of a set/reset latch connected to the output of the polarity hold latch, means operable during testing for clocking said set/reset latch with a different and non-overlapping clock signal to that of the polarity hold latch, and means operable during operation of said shift register latch as a D type edge trigger for clocking said polarity hold latch and said set/reset latch with the same clock signal.

Preferably the shift register latch is formed in a single semiconductor chip together with other logic circuits which conform to the LSSD rules. Thus all circuits on the chip can be tested with the same test apparatus and at the same time.

BRIEF DESCRIPTION OF THE DRAWINGS

The invention will now be particularly described, by way of example, with reference to the accompanying drawings, in which.

DESCRIPTION OF THE PREFERRED EMBODIMENTS

Figure 1:
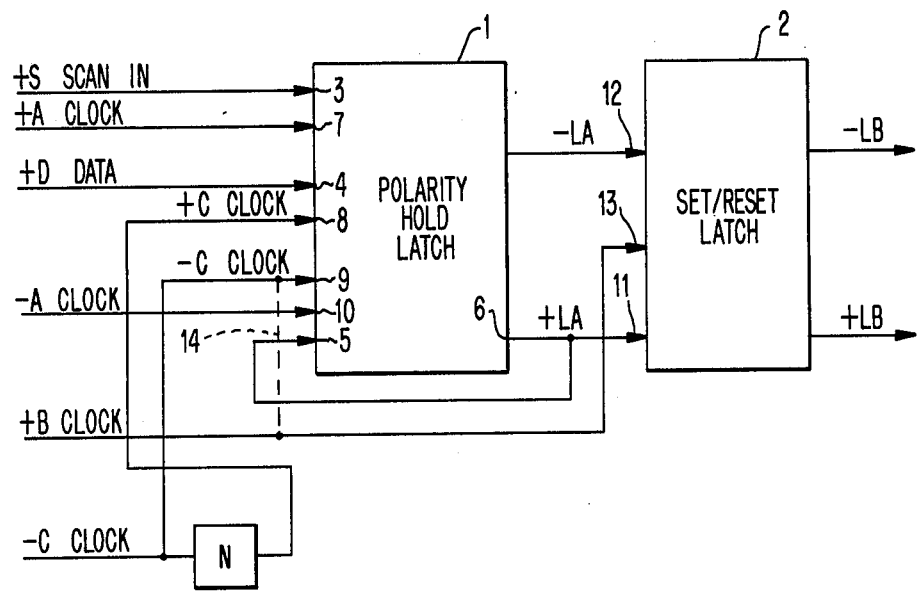
FIG. 1 is a block diagram of a shift register latch employing a polarity hold latch and a set/reset latch.

Referring now to FIG. 1, a shift register latch circuit consists of a polarity hold latch 1 connected to a set/reset latch 2. The polarity hold latch 1 has a scan-in input 3 for receiving test data, a data input 4 for receiving data during operation, a feedback input 5 for receiving feedback data from the +LA output 6, and clock inputs 7 to 10 for receiving clock signals. The set/reset latch 2 has a set-input 11 connected to receive the +LA output of latch 1, a reset input 12 connected to receive the −LA output of latch 1, and a clock input 13.

Figure 3:
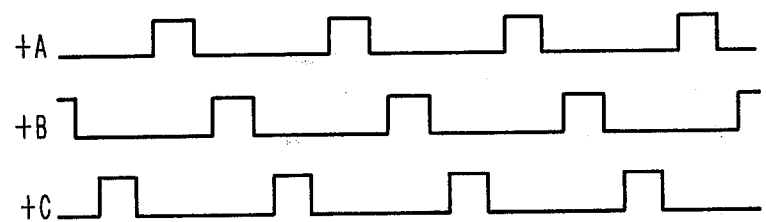
FIG. 3 is a timing diagram showing the relationship between various clock signals when the circuit of FIG. 1 is tested.

The clock trains +A, +B and +C are shown in FIG. 3. It will be seen that the clock trains +A, +B and +C are non-overlapping, that is a clock signal will not appear simultaneously with another clock signal. The +C clock signal is obtained, in our embodiment, using an inverter and the −C clock. This means that the shift register latch shown in FIG. 1 conforms to the Level Sensitive Scan Design (LSSD) rules referred to above. Thus, the polarity hold latch is clocked by a clock train which is independent of the clock train which clocks the set/reset latch. Accordingly, the circuit can be readily tested by automatically generated test patterns applied to the scan input 3 as described in the aforementioned patent specification.

Briefly however, the C clock is used to set conditions into the polarity hold latch, and then test patterns are scanned through the latch circuit using the A and B clocks. During scanning the C clock is not used.

During system operation, that is when the circuit is being used as a 'D'-type edge trigger, the clock input 13 of the set/reset latch 2 will be connected to the −C clock input 9 of the polarity hold latch 1 as represented by dotted line 14. System data is supplied to data input 4 and will be clocked under control of the +C clock. The A clock is not used. After a negative edge of the −C clock, the polarity hold latch 1 will follow the data input whilst the set/reset latch remains unchanged. On the next positive going edge of the −C clock signal, the information in the polarity hold latch 1 is transferred to the set/reset latch 2. The data input to latch 1 must not, of course, change whilst the polarity hold latch 1 is being set.

Figure 2:
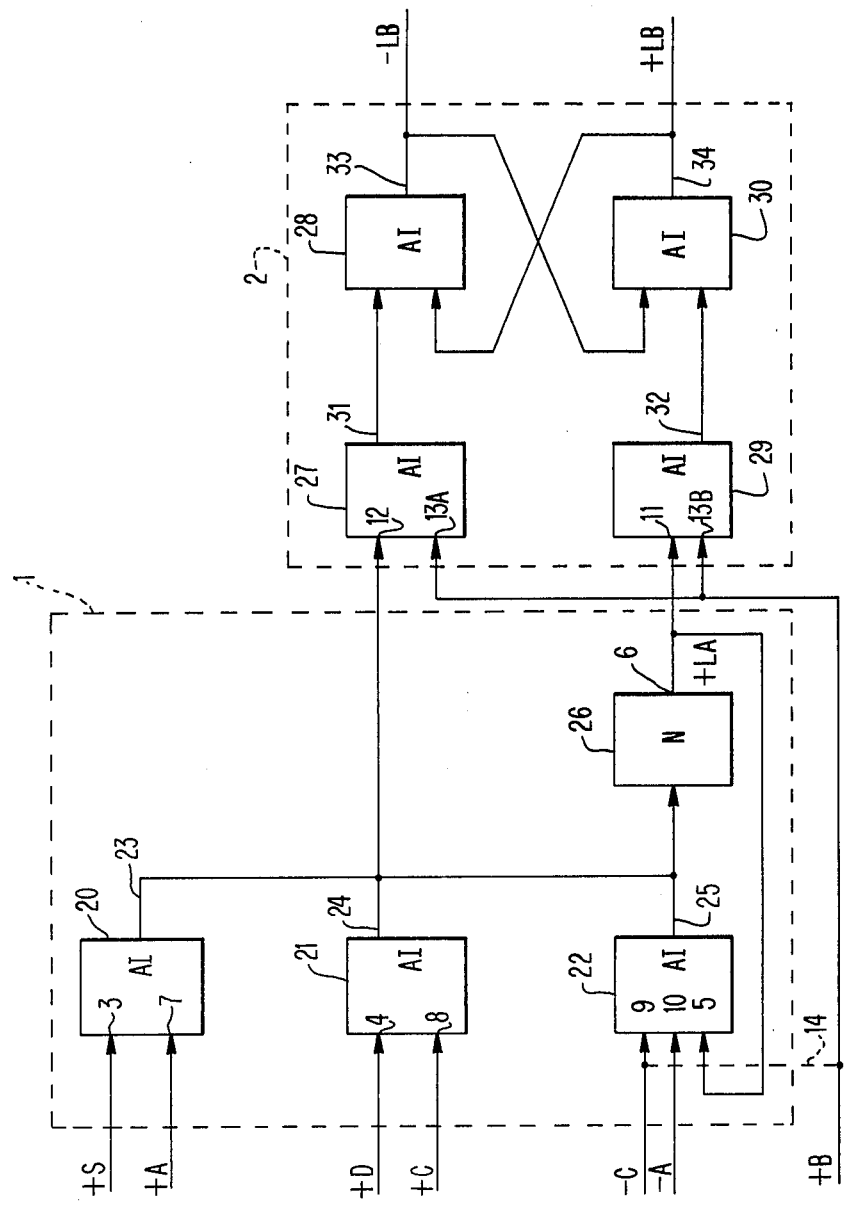
FIG. 2 is a block diagram of the shift register latch of FIG. 1 formed from seven AND INVERT blocks plus one INVERT block.

FIG. 2 is a block diagram showing how the shift register latch circuit of FIG. 1 can be implemented with seven AND INVERT gates plus one INVERT gate. Similar reference numerals have been used to signify similar parts of the circuit shown in FIG. 1. The polarity hold latch includes three AND INVERT gates 20, 21 and 22 having inputs 3 and 7, 4 and 8, and 9, 10 and 5 respectively. The outputs 23, 24 and 25 of the AND INVERT gates 20, 21 and 22 respectively constitute the −LA output of the polarity hold latch. The set/reset latch includes a reset path comprised of AND INVERT gates 27 and 28 and a set path comprised of AND INVERT gates 29 and 30. AND INVERT gates 27 and 29 have inputs 12 and 11 respectively to receive the −LA and +LA outputs respectively of the polarity hold latch and clock inputs 13A and 13B respectively, which are connected to the B clock train during test and to the −C clock train during system operation as represented by dotted line 14. AND INVERT gates 28 and 30 receive as inputs the outputs 31 and 32 respectively and the outputs 33 and 34 respectively of the AND INVERT gates 28 and 30 and which constitute the −LB and +LB outputs of the set/reset latch.

Operation of the circuit shown in FIG. 2 is as described above with reference to FIG. 1. During operation as an edge trigger, the clock inputs 13A and 13B of the set/reset gate are connected to the −C clock train.

Figure 4:
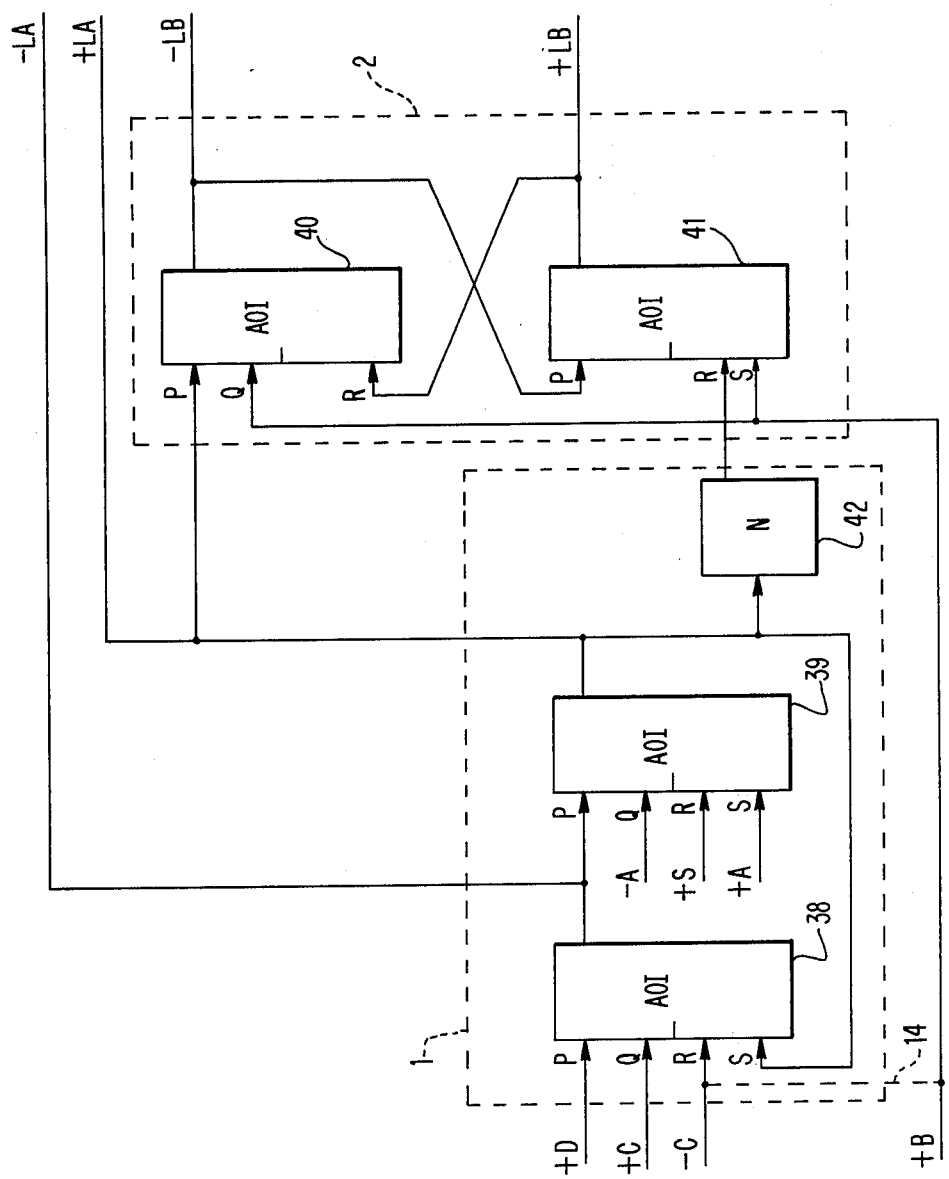
FIG. 4 is a block diagram of another embodiment of the invention in which the shift register latch of FIG. 1 is formed from four AND OR INVERT circuits plus one INVERT circuit.
Figure 5:
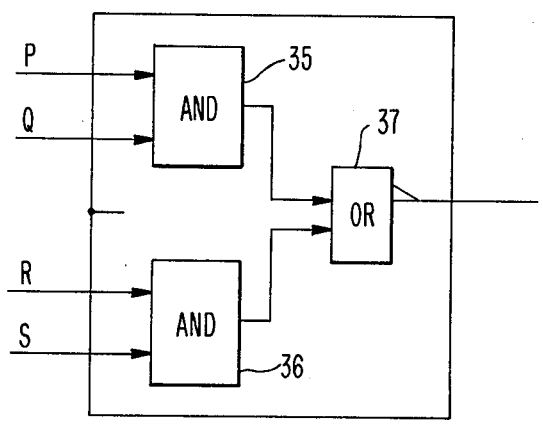
FIG. 5 illustrates the AND OR INVERT circuits of FIG. 4.

FIG. 4 shows how the shift register latch may be implemented with AND OR INVERT circuits and again similar parts have been given similar reference numerals. These AND OR INVERT gates can be formed from TTL bipolar transistor logic. Each AND OR INVERT circuit preferably has the form illustrated in FIG. 5 and consists of a pair of AND gates 35 and 36 whose true outputs feed an OR gate 37. The inverted output of the OR gate 37 constitutes the output of the AND OR INVERT circuit. Returning now to FIG. 4, the polarity hold latch is constituted by AND OR INVERT circuits 38 and 39 whilst the set/reset latch is constituted by AOI circuits 40 and 41.

A signal that is locally equivalent to the −LA output of the polarity hold latch is supplied to the input of the set-reset latch by inverting the +LA output of the polarity hold latch by means of an INVERTER 42. The use of this delayed −LA signal instead of the original −LA ensures that the −LA input to the set-reset latch is degated by the B clock going negative before the −LA input to the set-reset latch can change due to −C clock going negative. If the negative threshold of input AOI circuit 41 can be guaranteed to be faster than the negative threshold of input AOI circuit 38, then the inverter 42 can be eliminated and the −LA output of the polarity hold latch can be connected to AOI circuit 41 of the set/reset latch.

Operation of the shift register latch of FIG. 4 is identical to that described above with reference to FIGS. 1 and 2. During system operation, that is when the shift register latch is used as a 'D' type edge trigger, the +B clock input is connected to the −C clock as represented by dotted line 14.

Figure 6:
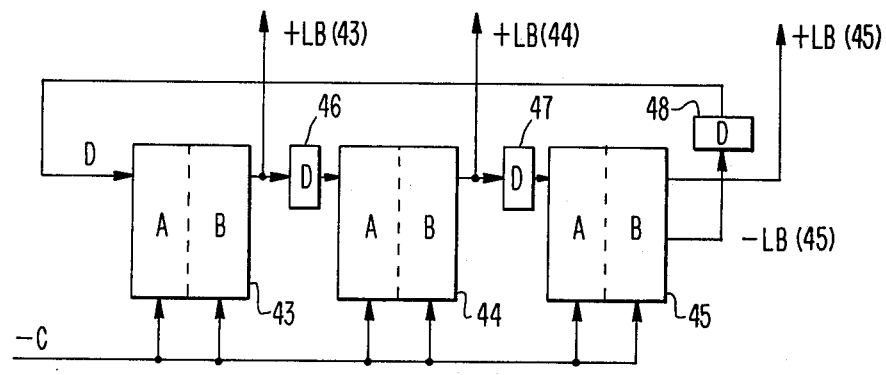
FIG. 6 illustrates how a number of shift register latch circuits can be connected together to form a Johnson counter.

FIG. 6 shows three shift register latches 43, 44 and 45 connected together to constitute a Johnson counter. Delays 46 and 47 are provided at the +LB outputs of latches 43 and 44 respectively and delay 48 is provided at the −LB output of latch 45. These delays, which may, for example be constituted by two inverters, are chosen to ensure that the polarity hold latches are not loaded with false information from the preceding set/reset latch. It will be appreciated that any number of shift register latches can be connected as shown and that there will be twice as many states as there are shift register latches in the chain. All shift register latches in the chain except the first receive the delayed +LB output from the set/reset latch of the preceding shift register latch on their data input. The first shift register latch receives the delayed −LB output from the set/reset latch of the last shift register latch on its data input.

Figure 7:
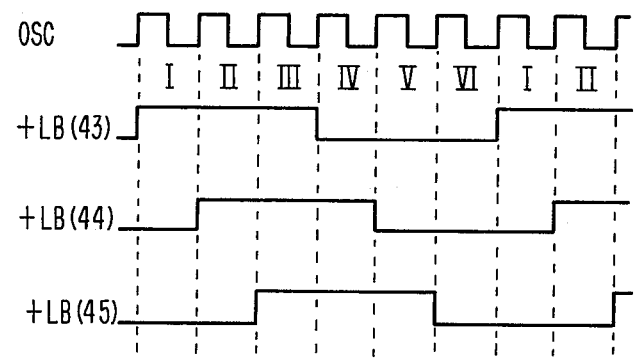
FIG. 7 is a timing diagram showing the operation of the counter of FIG. 6 when connected to a single oscillator.

During testing of the circuit, all clock trains will be used as normal. However, during operation of the circuit as a counter, all clock inputs will be connected to the −C clock which is constituted by an oscillator running, for example at 19.44 MHz. The circuit is first initialized, that is all of the latches are set to be off. This may be done by using the scan input (not shown) or alternatively the delay 48 can be a logic decoder designed to operate as a self starter. Thus, for example, where there are five shift register latches in the chain, a logic decoder consisting of a first AND gate recognizing when the first and second latches are on and the fourth and fifth latches are off, a second AND gate recognizing when the second, third, fourth and fifth latches are off, and an OR gate receiving the outputs of the first and second AND gates could be used which allow the first latch in the chain to be on only when these conditions are satisfied. FIG. 7 shows waveforms produced with the counter of FIG. 6. It will be recognized that the six states of the latches can be decoded by connecting the outputs +LB to appropriate decode logic. By this means, a series of non-overlapping clock signals can be produced. The six states of the latches are illustrated as I to VI in FIG. 7. What has been described is a shift register latch which conforms to the LSSD design rules and which can therefore be tested with automatic test pattern generation together with other circuits on the same semiconductor chip. In operation the latch is operable as a 'D' type edge trigger which can be used to build counters or a clock source when connected to a single oscillator. The connection between the +B clock input (of the set/reset latch) to the system clock (−C) can be made in any suitable manner. Thus it can be made through a normally on transistor switch which is switched off during testing or it can be made through a normally off transistor switch which is switched on during operation as an edge trigger. Alternatively, the connection can be made after test when the semiconductor chip or module containing the shift register latch is connected to other circuits.

While the invention has been particularly described with reference to the preferred embodiments thereof, it will be understood by those skilled in the art that the foregoing and other changes in form and details may be made therein without departing from the spirit and scope of the invention.

Having thus described my invention, what we claim as new, and desire to secure by Letters Patent is:

1. A shift register latch circuit for use in an integrated circuit conforming to Level Sensitive Scan Design (LSSD), said shift register latch circuit comprising:
    a first AND/INVERT circuit having a first input for receiving a SCAN IN input, a second input for receiving a first clock pulse train, and an output;
    a second AND/INVERT circuit having a first input for receiving a data input, a second input for receiving a second clock pulse train, and an output;
    a third AND/INVERT circuit having a first input for receiving the complement of said second clock pulse train, a second input for receiving the complement of said first clock pulse train, a third input, and an output;
    an Inverter circuit having an input and output;
    a fourth AND/INVERT circuit having a first input connected in common to said output of said first AND/INVERT circuit, said output of said second AND/INVERT circuit, said output of said third AND/INVERT circuit and said input of said Inverter circuit, a second input, and an output;
    a fifth AND/INVERT circuit having a first input connected in common to said output of said Inverter circuit and said third input of said third AND/INVERT circuit, a second input connected in common with said second input of said fourth AND INVERT circuit for receiving a third clock pulse train, and an output;
    a sixth AND/INVERT circuit having a first input connected to said output of said fourth AND/INVERT circuit, a second input, and an output; and
    a seventh AND/INVERT circuit having a first input connected to said output of said sixth AND/INVERT circuit, a second input connected to said output of said fifth AND/INVERT circuit and an output connected to said second input of said sixth AND/INVERT.

2. A shift register latch circuit as recited in claim 1 wherein said second input of said fourth AND/INVERT circuit and said second input of said fifth AND/INVERT circuit are connected in common to the complement of said second clock pulse train rather than said third clock pulse train.

3. A shift register latch circuit for use in an integrated circuit conforming to Level Sensitive Scan Design (LSSD), said shift register latch circuit comprising:
    a first AND/OR/INVERT circuit having a first input for receiving data, a second input for receiving a first clock pulse train, a third input for receiving the complement of said first clock pulse train, a fourth input, and an output;
    a second AND/OR/INVERT circuit having a first input connected to the output of said first AND/OR/INVERT circuit, a second input for receiving the complement of a second clock pulse train, a third input for receiving a SCAN IN input, a fourth input for receiving said second clock pulse train, and an output;
    an Inverter circuit having an input and an output;
    a third AND/OR/INVERT circuit having a first input connected in common to said fourth input of said first AND/OR/INVERT circuit, said input of said Inverter circuit and said output of said second AND/OR/INVERT circuit, a second input, a third input, and an output;
    a fourth AND/OR/INVERT circuit having a first input connected to said output of said third AND/OR/INVERT circuit, a second input connected to the output of said Inverter circuit, a third input connected in common to said second input of said third AND/OR/INVERT circuit for receiving a third clock pulse train, and an output connected to said third input of said third AND/OR/INVERT circuit.

4. A shift register latch circuit as recited in claim 3 wherein said third input of said fourth AND/OR/INVERT circuit and said second input of said third AND/OR/INVERT circuit are connected in common to the complement of said first clock pulse train rather than said third clock pulse train.

* * * * *